United States Patent [19]
Miyabe et al.

[11] Patent Number: 5,481,267
[45] Date of Patent: Jan. 2, 1996

[54] SAMPLING RATE CONVERTER

[75] Inventors: Satoru Miyabe; Akira Toyama; Minoru Takeda, all of Tokyo, Japan

[73] Assignee: Nippon Precision Circuits Inc., Tokyo, Japan

[21] Appl. No.: 176,560

[22] Filed: Jan. 3, 1994

[30] Foreign Application Priority Data

| Jan. 7, 1993 | [JP] | Japan | 5-001158 |
| Oct. 28, 1993 | [JP] | Japan | 5-270451 |

[51] Int. Cl.[6] .................................. H03M 7/00
[52] U.S. Cl. ........................... 341/61; 364/724.1
[58] Field of Search ............................ 341/61; 364/724.1

[56] References Cited

U.S. PATENT DOCUMENTS

| 4,748,578 | 5/1988 | Lagadec et al. | 364/724.1 |
| 4,825,398 | 4/1989 | Koch et al. | 364/724.1 |
| 4,896,334 | 1/1990 | Sayar. | |
| 4,953,117 | 8/1990 | Lagadec | 364/724.1 |
| 5,159,338 | 10/1992 | Takahashi | 341/61 |
| 5,159,339 | 10/1992 | Fujita | 341/61 |
| 5,398,029 | 3/1995 | Toyama et al. | 341/61 |

FOREIGN PATENT DOCUMENTS

WO92/17951 10/1992 WIPO.

*Primary Examiner*—Howard L. Williams
*Attorney, Agent, or Firm*—Jordan and Hamburg

[57] ABSTRACT

A sampling rate converter for converting a first signal having a first sampling rate to a second signal having a second sampling rate, includes a circuit for generating first data corresponding to the ratio of the second sampling rate to the first sampling rate. A second circuit generates second data by correcting the first data with corrective data. A third circuit generates third data corresponding to an estimated output timing of the second signal based upon the second data. A comparator compares the third data with a fourth data corresponding to the actual output timing of the second signal to generate comparative data. A corrective circuit is responsive to the comparative data to generate the corrective data. A further circuit is responsive to the first and third data for generating the second signal.

5 Claims, 7 Drawing Sheets

SAMPLING RATE CONVERTER

FIELD OF THE INVENTION

The present invention relates to a sampling rate converter for use in digital audio applications and similar applications.

BACKGROUND OF THE INVENTION

Digital signals used in digital audio applications and similar applications are sampled at rates which are different in different systems. Therefore, in order to exchange data between the different systems, it is necessary to convert one sampling rate to another. An apparatus which converts one sampling rate to another while maintaining the waveforms of audio signals or the like in this way is known as a sampling rate converter.

When the output sampling timing is asynchronous with the input sampling timing, or when the ratio of the output sampling rate to the input sampling rate cannot be expressed in terms of a simple combination of integers, the ratio of the output sampling rate to the input sampling rate is accurately found, and then the sampling rate is converted to a different value, based on the accurately found ratio. In the prior art techniques, both the input sampling rate and the output sampling rate have been averaged in order to accurately find the sampling rate ratio.

In order to secure high accuracy, however, it is necessary to make the averaging time very long. Therefore, if the input and output sampling rates jitter at all, then the number of items of data calculated is not coincident with the number of items of data actually delivered. As a result, a malfunction occurs.

SUMMARY OF THE INVENTION

It is an object of the present invention to provide an accurate sampling rate converter capable of operating stably.

The present invention lies in the provision of a sampling rate converter for converting a first signal of a first sampling rate to a second signal of a second sampling rate, wherein the sampling rate converter comprises a first data-generating circuit for generating first data related to the ratio of the second sampling rate to the first sampling rate. A second data-generating circuit is provided for generating second data by correcting the first data using corrective data. A third data-generating circuit generates, based on the second data, third data which corresponds to the estimated output timing of the second signal.

A comparator circuit generates comparative data by comparing the third data with fourth data which corresponds to the actual output timing of the second signal. A correcting circuit generates the corrective data, based on the comparative data, and a second signal-generating circuit generates the second signal based on the first and third data.

DESCRIPTION OF THE PREFERRED EMBODIMENTS

Figure 1:
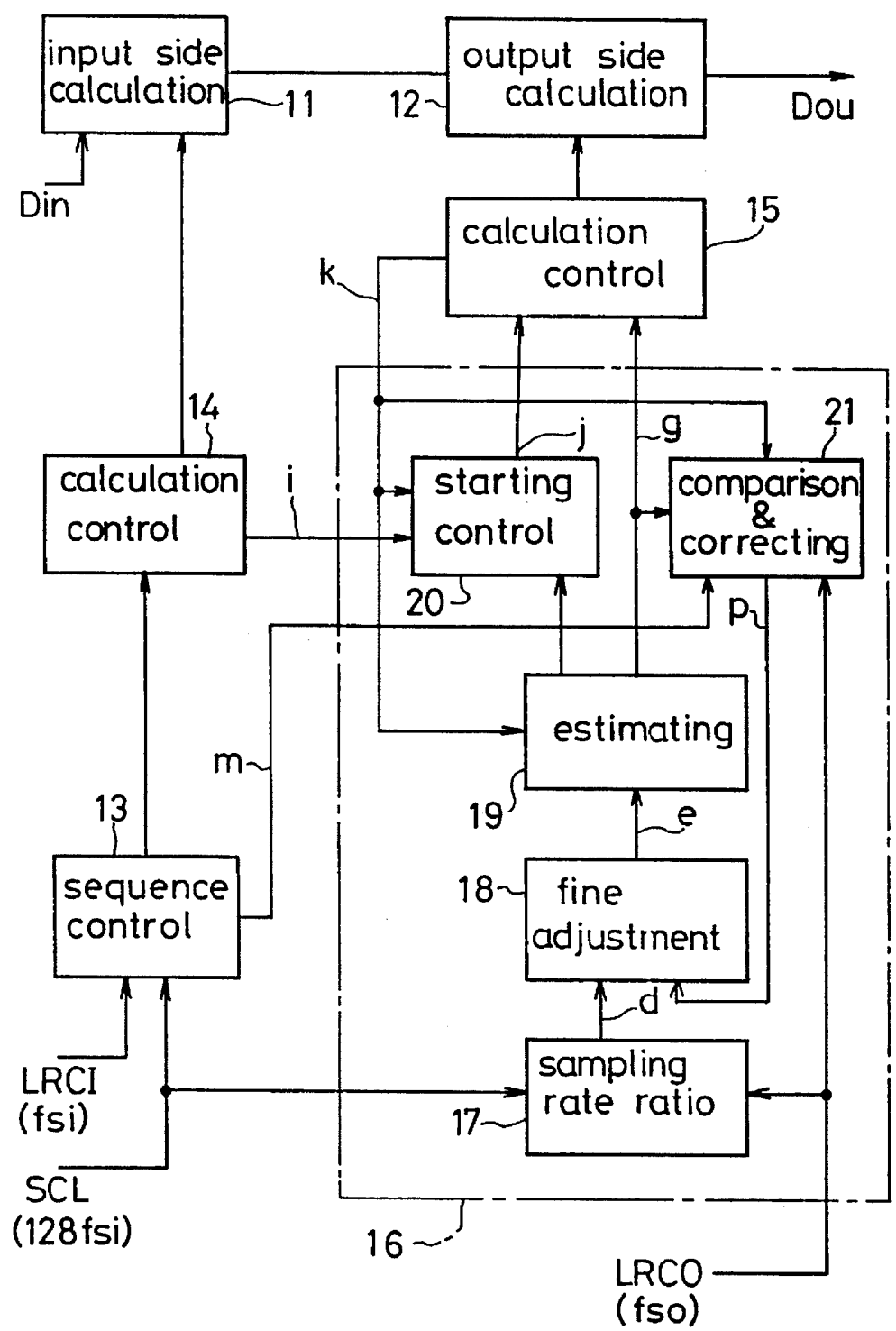
FIG. 1 is a block diagram showing the whole structure of a sampling rate converter according to the present invention.
Figure 2:
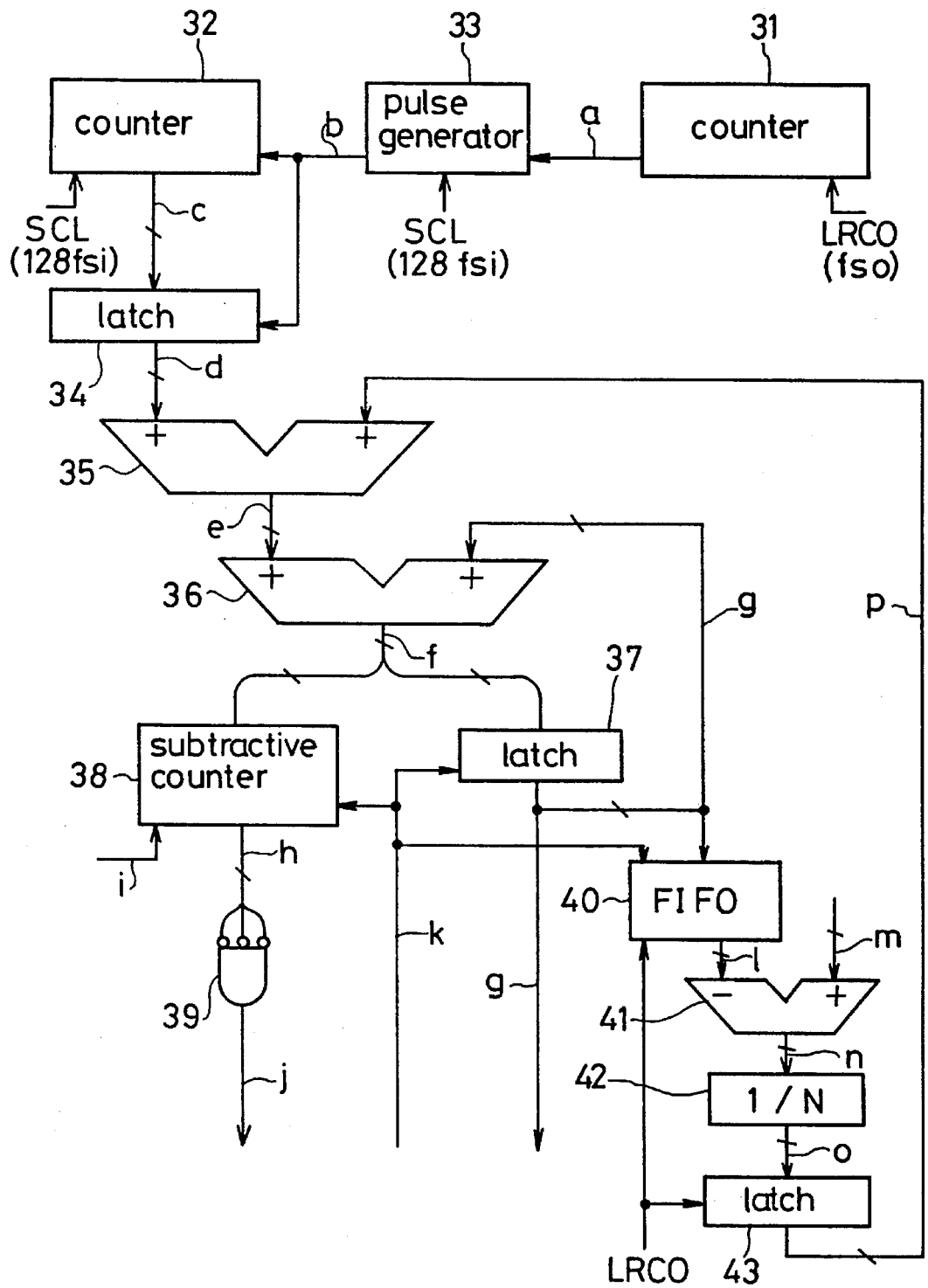
FIG. 2 is a block diagram of a first embodiment of the invention, particularly showing the timing data-generating block 16 shown in FIG. 1.
Figure 3:
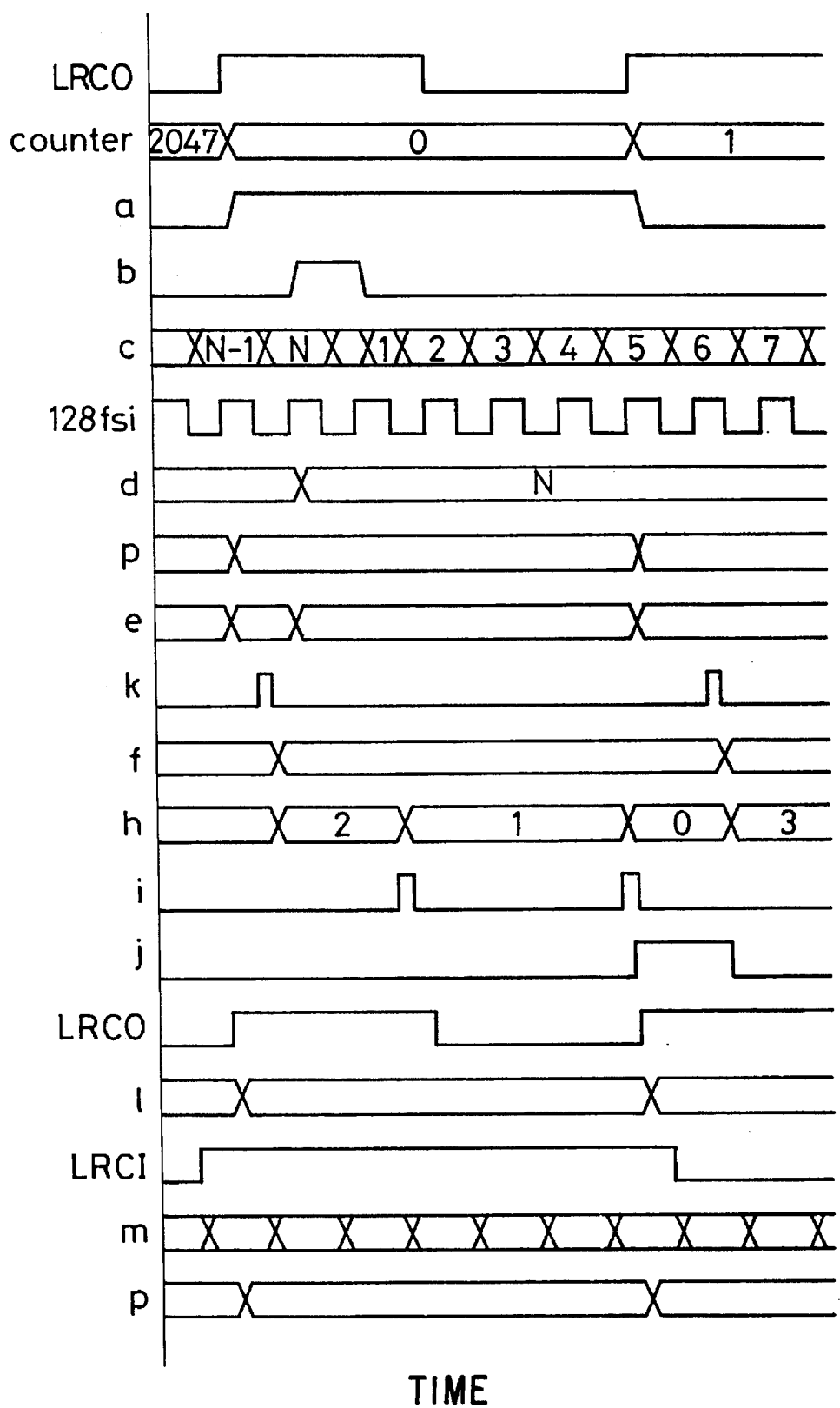
FIG. 3 is a timing chart illustrating the operation of the converter shown in FIGS. 1 and 2.
Figure 4:
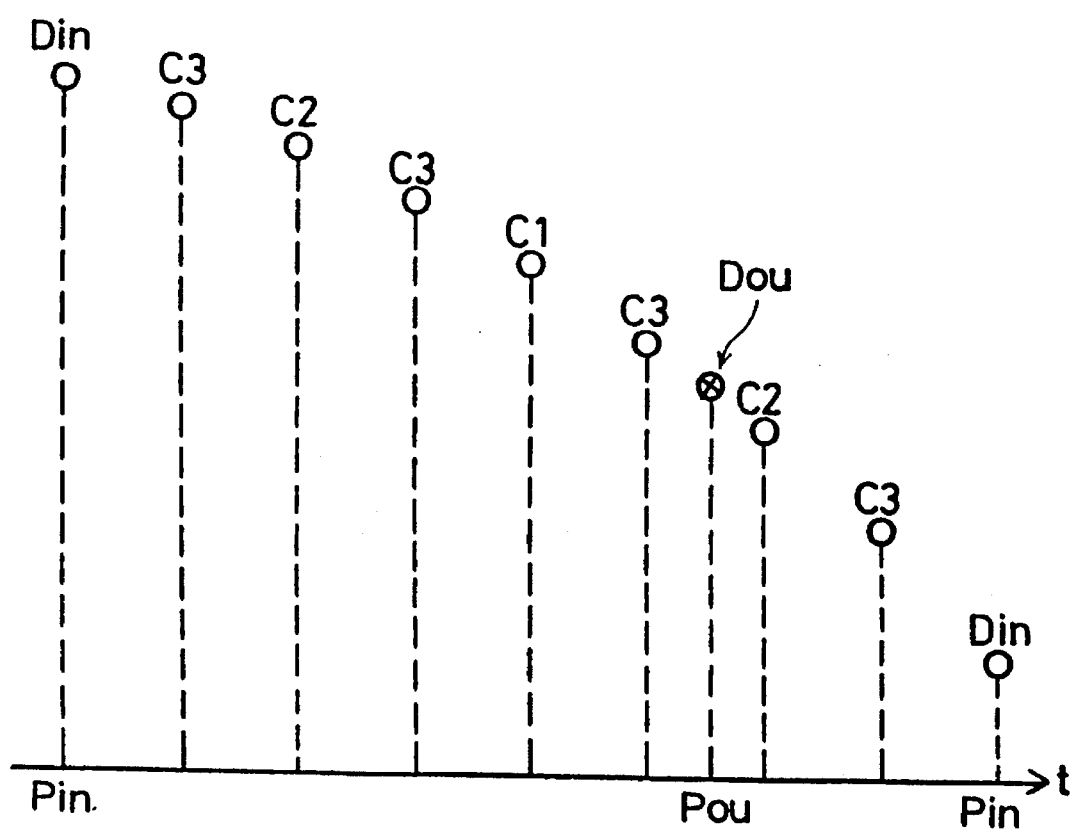
FIG. 4 is a diagram illustrating an interpolation operation performed by the sampling rate converter shown in FIG. 1.

A first embodiment of sampling rate converter according to the present invention will be hereinafter described with reference to FIGS. 1, 2, 3 and 4. FIG. 1 is a block diagram showing the whole structure of the sampling rate converter. FIG. 2 is a block diagram, particularly showing the structure of the timing data-generating block 16 shown in FIG. 1. FIG. 3 is a timing chart illustrating the operation of the structures shown in FIGS. 1 and 2. FIG. 4 is a diagram illustrating an interpolation operation performed by the sampling rate converter.

The structure of the first embodiment will now be described with reference to FIGS. 1 and 2.

An input calculation circuit 11 and an output calculation circuit 12 mainly act to perform arithmetic operations for interpolation. These arithmetic operations for interpolation will be described with reference to FIG. 4, wherein the sampling rate converter of the described embodiment converts input data Din of sampling frequency $f_{si}$ to output data Dou of sampling frequency $f_{so}$. During the conversion, arithmetic operations for interpolation (hereinafter referred to as the input arithmetic operations) are performed about sampling points Pin corresponding to the output data Din by digital filtering techniques. In this manner, interpolated points C1, C2, and C3 are found. However, the interpolated points C1, C2, and C3 on the time axis t do not generally agree with the sampling points Pou corresponding to the output data Dou. Accordingly, arithmetic operations for an interpolation such as a linear interpolation (hereinafter referred to as the output arithmetic operations) are carried out for adjacent interpolated points to find output data Dou corresponding to the output sampling points Pou. The input arithmetic circuit 11 mainly serves to perform the arithmetic operations on the input signals. The output arithmetic circuit 12 principally acts to perform the arithmetic operations on the output signals.

Referring again to FIG. 1, a sequence control circuit 13 controls the whole operation of the sampling rate converter. This control circuit 13 receives input word clock pulses LRCI having a frequency of $f_{si}$ corresponding to the input sampling rate and system clock pulses SCL having a frequency of 128 $f_{si}$ and produces a starting signal for application to a calculation control circuit 14. The control circuit 13 also produces data m related to a reference time for application to a comparison-and-correcting circuit 17. The data m related to the reference time indicates the reference time on which the whole system is based. Various kinds of timing data are created from this reference time data.

The calculation control circuit 14 controls the input calculation circuit 11. Another calculation control circuit 15 controls the output arithmetic circuit 12.

The individual components of the timing data-generating block 16 will now be described. First, the main functions of the timing data-generating block will be described. The output data Dou are produced in synchronism with the output word clock pulses LRCO having a frequency $f_{so}$ corresponding to the output sampling rate. Therefore, arithmetic operations performed by the output calculation circuit 12 for generating the output data Dou are preferably carried out, based on actual output timing data produced when the output word clock pulses LRCO are produced, i.e., based on the data m related to the reference time when the output word clock pulses LRCO are produced. In order to create the output data Dou, however, some calculation time is needed. For this reason, it is impossible to perform the calculation, directly using the data m related to the reference time. Accordingly, actual output timing is estimated (forecast) and estimated (forecast) output timing data g is created by the timing data-generating block 16. The output calculation circuit 12 performs the calculation, based on the estimated (forecast) output timing data g. It follows that a difference, or an error, is produced between the estimated (forecast) output timing data g and the actual output timing data, i.e., the data m related to the reference time. As will be described later, the time data-generating block 16 makes this error infinitesimal..

The sampling rate ratio-generating circuit 17 creates data d about the ratio of the output sampling rate to the input sampling rate. Since the data d is used to generate the estimated (forecast) output timing data g which is required to be quite accurate, the data d is generated with high accuracy. Counters 31, 32, a pulse generator circuit 33, and a latch 34 shown in FIG. 2 principally correspond to the sampling rate ratio-generating circuit 17.

A fine adjustment circuit 18 corrects the data d, using corrective data p described later, and generates more accurate data e. An adder 35 shown in FIG. 2 mainly corresponds to this fine adjustment circuit 18.

An estimating (forecasting) circuit 19 receives the data e and generates the estimated (forecast) output timing data g under the control of an output side calculation end signal k from the calculation control circuit 15. The output side calculation end signal k is a signal indicating the end of each calculation performed by the output arithmetic circuit 12. An adder 36 and a latch 37 shown in FIG. 2 mainly correspond to this forecasting circuit 19.

A starting control circuit 20 creates an output calculation starting request signal j under the control of both an input calculation end signal i from the calculation control circuit 14 and the output calculation end signal k from the calculation control circuit 15. The input calculation end signal i is a signal indicating the end of each calculation performed by the input calculation circuit 11. The output calculation starting request signal j is a signal requiring a start of calculation at the output arithmetic circuit 12.

A substractive counter 38 and a gate 39 shown in FIG. 2 mainly correspond to this starting control circuit 20.

The comparison-and-correcting circuit 21 compares the estimated (forecast) output timing data g with the actual output timing data, i.e., the data m related to the reference time, and creates corrective data p from the results of the comparison (also referred to as the corrective data herein). The timing of the comparison operation is synchronized to the output word clock pulses LRCO. An FIFO buffer 40, an adder 41, a 1/N circuit 42, and a latch 43 shown in FIG. 2 mainly correspond to this comparison-and-correcting circuit 21.

The operation of the embodiment shown in FIGS. 1 and 2 will now be described with reference to the timing chart of FIG. 3.

The counter 31 forwardly counts the output word clock pulses LRCO of the frequency $f_{so}$, and produces output a whenever 2048 pulses are counted. The counter 32 forwardly counts the system clock pulses SCL having the frequency of 128 $f_{si}$. The pulse generator circuit 33 receives the output a from the counter 31 and produces a latch pulse b at every leading edge of the system clock pulses SCL. At the leading edge of this latch pulse b, the count value c of the counter 32 is latched in the latch 34. At the trailing edge, the count value of the counter 32 is set to 1. As a result, the output data d from the latch 34 is $2048 \times 128 \times (f_{si}/f_{so})$. As a consequence, accurate data about the ratio of the output sampling rate to the input sampling rate is derived.

The adder 35 produces the sum of the data d from the latch 34 and the corrective data p from the latch 43. Although the data d itself is sufficiently accurate data, a fine adjustment is made, using the corrective data p. In this way, more accurate data e is obtained.

The adder 36 calculates the sum of the data e and the estimated (forecast) output timing data g from the latch 37 and produces 22-bit data f. The least significant 19 bits of the data f are latched in the latch 37 in response to the output side calculation end signal k. The 3 most significant bits are preset into the subtractive counter 38, which is decremented at every application of the input side calculation end signal i. When the output h from the subtractive counter 38 decreases to 0, the gate 39 produces the output calculation starting request signal j, so that the output calculation circuit 12 starts a sequence of output calculations. When this sequence ends, the output calculation end signal k becomes active. In this way, whenever the signal k becomes active, the estimated (forecast) output timing data g from the latch 37 is replaced by successive new data.

The estimated (forecast) output timing data g is successively accepted into the FIFO buffer 40 in response to the output calculation end signal k and successively delivered from the buffer 40 in response to the output word clock pulses LRCO. Output data "1" from the FIFO buffer 40 is applied to the negative input terminal of the adder 41, while the data m related to the reference time is applied to the positive input terminal of the adder 41. That is, the estimated (forecast) output timing data g is compared with the data m related to the reference time (corresponding to the actual output timing) at the timing of the output word clock pulses LRCO. Data about the resulting error (referred to as the error data herein) is produced by the adder 41. The error data n from the adder 41 is reduced by a factor of 2048 by the 1/N circuit 42. The reduced data o is latched in the latch 43 in response to the output word clock pulses LRCO. The output from the latch 43 is applied as the corrective data p to the adder 35. The error data n is diminished by the 1/N circuit 42, because if the corrective data p is too large, then the effect of every instantaneous variation becomes great, thus risking the stability.

In the present embodiment, the data d itself related to the ratio of the output sampling rate to the input sampling rate is sufficiently accurate. However, if the embodiment relies only on this, and if the input and output sampling rates jitter at all, then the error between the estimated (forecast) output timing and the actual output timing might be accumulated. Therefore, the data d is finely adjusted, using the corrective data p. Thus, accurate and stable, estimated (forecast) output timing data g is generated.

A second embodiment of sampling rate converter according to the present invention will now be described with reference to FIG. 5.

Figure 5:
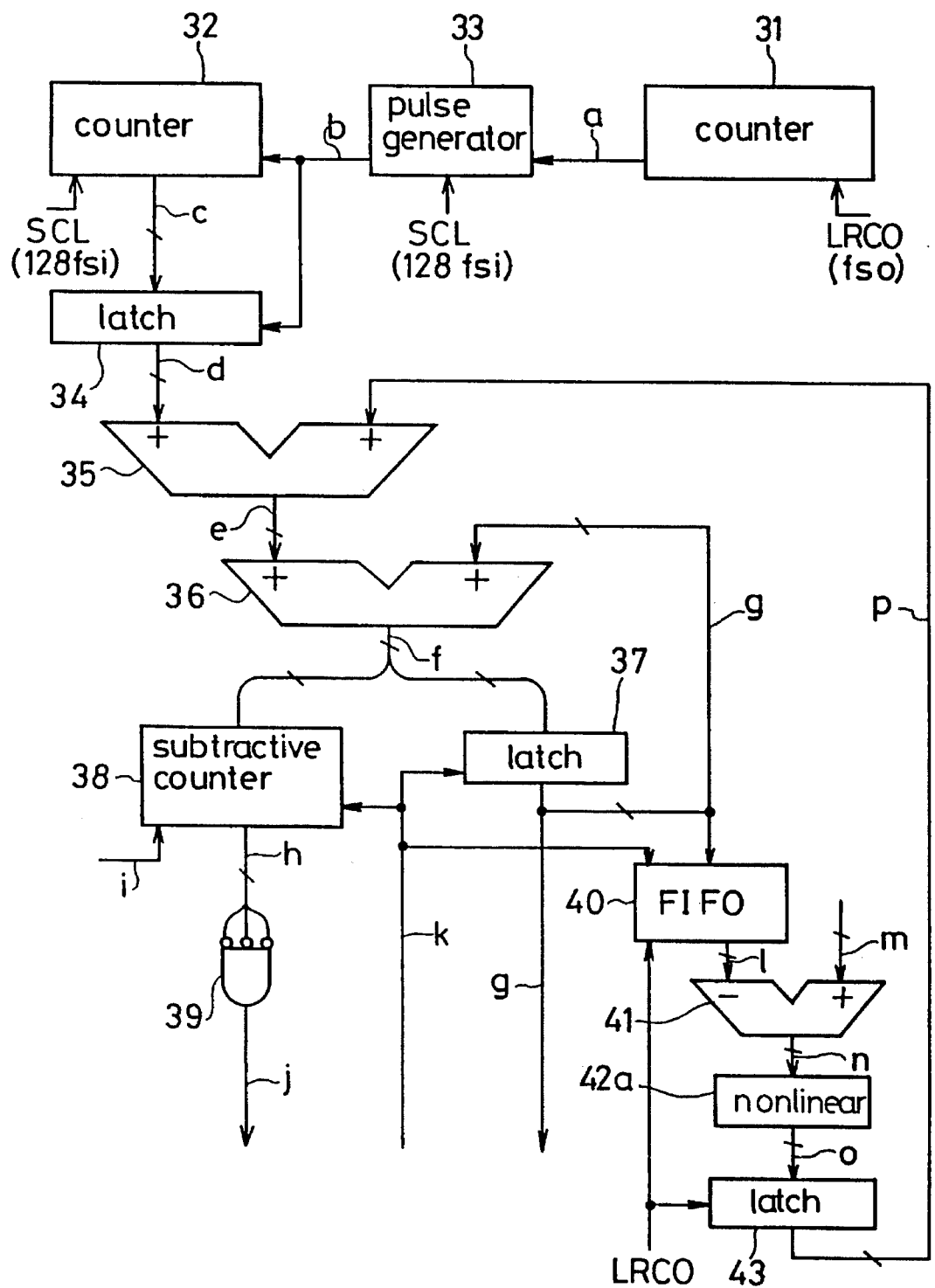
FIG. 5 is a block diagram of a second embodiment of the invention, particularly showing the timing data-generating block 16 shown in FIG. 1.

As can be seen in FIGS. 2 and 5, the second embodiment is similar to the first embodiment except that a nonlinear correcting circuit 42a is provided instead of the 1/N circuit 42 (linear correcting circuit) of the first embodiment.

In the first embodiment shown in FIG. 2, in order to prevent malfunction due to variations in the input and output sampling rates, corrections are made by using the 1/N circuit 42 (linear correcting circuit) in a correcting circuit. In order to carry out the corrections, the corrections must be highly accurate for minute variations in the input and output sampling rates. The corrections must show good response to great variations in the input and output sampling rates. However, in the 1/N circuit 42 of the first embodiment, if the value of N is increased, the correction accuracy is improved but the response to variations in the sampling rates deteriorates. Conversely, if the value of N is reduced, the response to variations in the sampling rates is improved but the correction accuracy is deteriorated. To satisfy these two requirements, it is necessary to switch the value of N according to the amounts of change in the input and output sampling rates or to increase the number of stages of the FIFO buffer 40.

Figure 6:
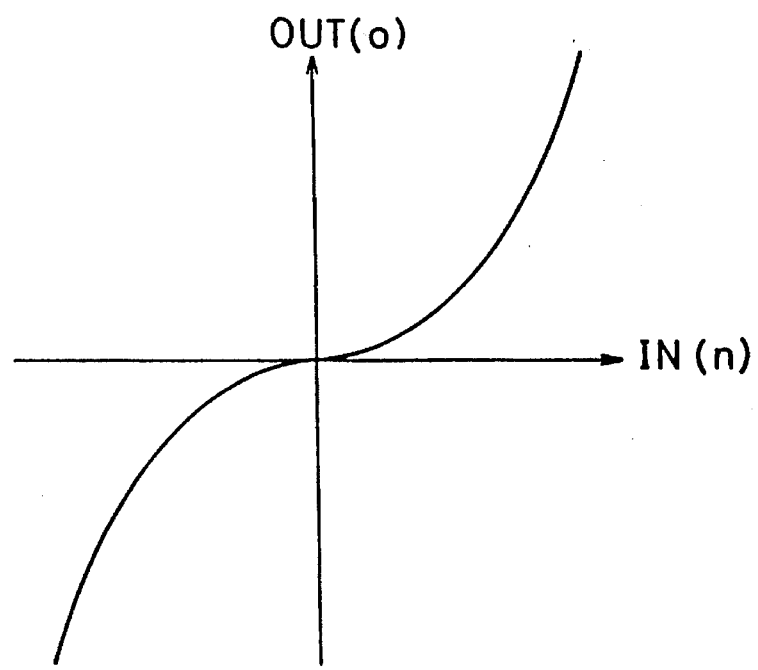
FIG. 6 is a graph showing an input-output characteristic of the nonlinear correcting circuit shown in FIG. 5.

Accordingly, in the second embodiment, accurate corrections are made in response to minute variations in the input and output sampling rates. Corrections are made with good response to large variations in the input and output sampling rates. For this purpose, the nonlinear correcting circuit 42a shown in FIG. 5 is provided as a correcting circuit. This correcting circuit 42a creates an odd power (e.g., the third power) of the input data n as output data o. The relation of the output to the input, which corresponds to the relation of the error data n to the corrective data p, is shown in FIG. 6. In this nonlinear correcting circuit 42a, minute error data n close to the origin of the graph of FIG. 6 are further reduced to create the corrective data p. This is because if the corrective data p is too great compared with the error data n, the effect of every instantaneous error variation becomes large. This might deteriorate the stability. In the nonlinear correcting circuit 42a, large error data n remote from the origin of the graph of FIG. 6 are amplified, thus creating corrective data p. This is intended to make corrections with good response to large variations in the input and output sampling rates. In the nonlinear correcting circuit 42a, the corrective data p is created, for example, following a cubic curve. Therefore, just when the error begins to increase, the amplification factor does not increase rapidly. Rather, the circuit can smoothly follow the error.

Figure 7:
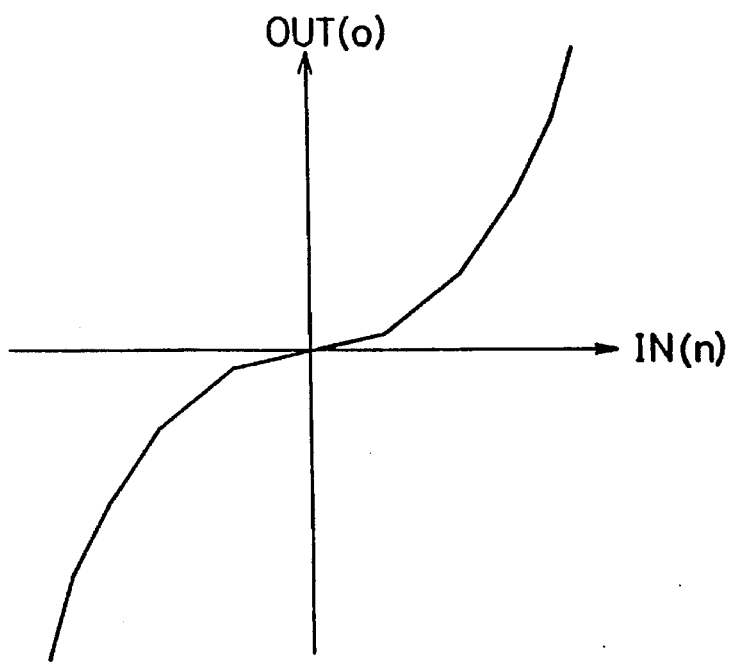
FIG. 7 is a graph showing another input-out characteristic of the nonlinear correcting circuit shown in FIG. 5.
Figure 8:
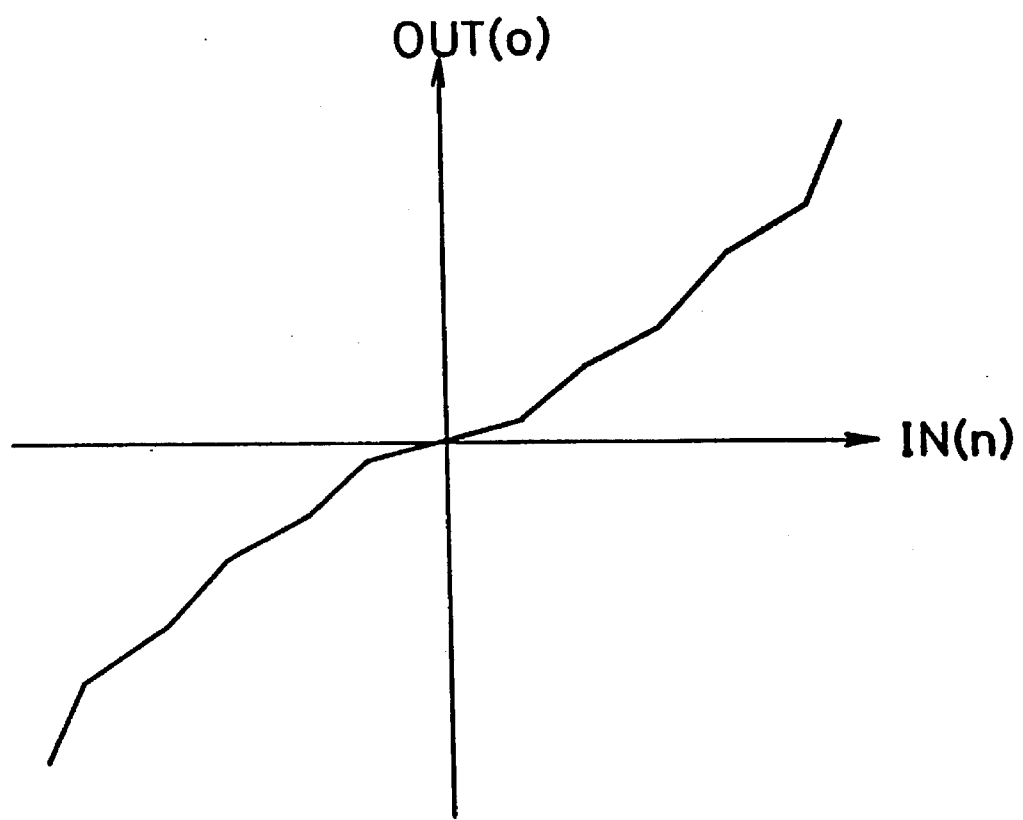
FIG. 8 is a graph showing a further input-out characteristic of the nonlinear correcting circuit shown in FIG. 5.

Generally, input data n supplied to the nonlinear correcting circuit 42a and output data o from it have a digital form. Therefore, the relation of the output to the input to the nonlinear correcting circuit 42a can be expressed by bent lines as shown in FIGS. 7 and 8. Generally speaking, this nonlinear correcting circuit 42a acts to generate output data o (corresponding to the corrective data p) in such a way that the rate of increase of the absolute value of the output data o (corresponding to the corrective data p) with respect to an increase in the absolute value of the input data n (the error data n) increases as the absolute value of the input data n (the error data n) increases. Alternatively, the relation of the output data o (corresponding to the corrective data p) to the input data n, or the error data n, is based on such a function that the rate of increase of the absolute value of the output data o (corresponding to the corrective data p) with respect to increase in the absolute value of the input data n (the error data n) increases as the absolute value of the input data n (the error data n) increases, and the nonlinear correcting circuit digitally approximates the function and creates corrective data.

In the second embodiment, the data d related to the ratio of the output sampling rate to the input sampling rate is sufficiently accurate, in the same way as in the first embodiment. However, if the embodiment relies only on this, and if the input and output sampling rates jitter at all, then the difference, or an error, between the estimated (forecast) output timing and the actual output timing might be accumulated. When either the input or output sampling clock is varied to thereby induce great variations, there arises a possibility that a very large difference is produced between the estimated (forecast) output timing and the actual output timing. Thus, the data d is adjusted using the corrective data p. The estimated (forecast) output timing data g show accurate and stable characteristics for small variations in the input and output sampling rates and exhibit quick and smooth response to large variations in the input and output sampling rates.

The present invention permits fabrication of an accurate sampling rate converter capable of operating stably.

What we claim is:

1. A sampling rate converter for converting a first signal of a first sampling rate to a second signal of a second sampling rate, said sampling rate converter comprising:

a first data-generating circuit for generating first data which corresponds to the ratio of said second sampling rate to said first sampling rate;

a second data-generating circuit for generating second data by correcting said first data with corrective data;

a third data-generating circuit for generating, based on said second data, third data which corresponds to estimated output timing of said second signal;

a comparator circuit for generating comparative data by comparing said third data with fourth data which corresponds to actual output timing of said second signal;

a correcting circuit for generating said corrective data, based on said comparative data; and a second signal-generating circuit for generating said second signal based on said first and third data.

2. The sampling rate converter of claim 1, wherein said comparator circuit comprises means for generating comparative data that is error data indicative of a difference between said third data and said fourth data.

3. The sampling rate converter of claim 2, wherein said correcting circuit comprises means for generating said corrective data by multiplying said error data by a factor of 1/constant value.

4. The sampling rate converter of claim 2, wherein said correcting circuit comprises means for generating said corrective data such that a rate of increase of the absolute value of said corrective data with respect to an increase in the absolute value of said error data increases as the absolute value of said error data increases.

5. The sampling rate converter of claim 2, wherein a relation between said error data and said corrective data is based on such a function that a rate of increase of the absolute value of said corrective data with respect to an increase in the absolute value of said error data increases as the absolute value of said error data increases, and wherein said correcting circuit comprises means for digitally approximating said function and generating said corrective data.

* * * * *